(12) United States Patent
Huang et al.

(10) Patent No.: US 11,837,491 B2
(45) Date of Patent: Dec. 5, 2023

(54) ELECTROSTATIC CHUCK AND REACTION CHAMBER

(71) Applicant: BEIJING NAURA MICROELECTRONICS EQUIPMENT CO., LTD., Beijing (CN)

(72) Inventors: Qiwei Huang, Beijing (CN); Quanyu Shi, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 402 days.

(21) Appl. No.: 17/276,748

(22) PCT Filed: Sep. 19, 2019

(86) PCT No.: PCT/CN2019/106684
§ 371 (c)(1),
(2) Date: Mar. 16, 2021

(87) PCT Pub. No.: WO2020/073779
PCT Pub. Date: Apr. 16, 2020

(65) Prior Publication Data
US 2022/0051923 A1     Feb. 17, 2022

(30) Foreign Application Priority Data

Oct. 11, 2018  (CN) .......................... 201811183845.3
Oct. 11, 2018  (CN) .......................... 201821648321.2

(51) Int. Cl.
*H01T 23/00*   (2006.01)
*H01L 21/683*  (2006.01)
*H01L 21/67*   (2006.01)

(52) U.S. Cl.
CPC .... *H01L 21/6833* (2013.01); *H01L 21/67109* (2013.01)

(58) Field of Classification Search
None
See application file for complete search history.

(56) References Cited

U.S. PATENT DOCUMENTS

| 6,432,208 B1 | 8/2002 | Kawakami et al. |
| 9,847,240 B2 * | 12/2017 | Lee ............................ F28D 1/06 |
| 2016/0379853 A1 | 12/2016 | Schaller et al. |

FOREIGN PATENT DOCUMENTS

| CN | 103325714 A | 9/2013 |
| CN | 104377155 A | 2/2015 |

(Continued)

OTHER PUBLICATIONS

World Intellectual Property Organization (WIPO) International Search Report for PCT/CN2019/106684 dated Dec. 18, 2019 6 Pages (including translation).

*Primary Examiner* — Stephen W Jackson
(74) *Attorney, Agent, or Firm* — ANOVA LAW GROUP, PLLC

(57) ABSTRACT

The present disclosure provides an electrostatic chuck and a reaction chamber. The electrostatic chuck includes an insulation layer and a heating body arranged at a bottom of the insulation layer. The electrostatic chuck further includes a cooling pipeline. The cooling pipeline is arranged under the heating body, spaced apart from the heating body, and configured to transfer cooling liquid to absorb heat radiated by the heating body. The electrostatic chuck further includes a thin-wall structure respectively connected to the heating body and the cooling pipeline. The thin-wall structure is configured to reduce heat dissipation efficiency between the heating body and the cooling pipeline. The electrostatic chuck provided by the present disclosure may realize stable (Continued)

temperature control for the heating body during a processing process to effectively reduce whisker defects and to improve the product yield.

20 Claims, 5 Drawing Sheets

(56) References Cited

FOREIGN PATENT DOCUMENTS

| | | | |
|---|---|---|---|
| CN | 208923079 U | 5/2019 | |
| JP | 2000299288 A | 10/2000 | |
| JP | 2000299371 A | 10/2000 | |
| JP | 2006165475 A | 6/2006 | |
| JP | 2010199107 A | 9/2010 | |
| JP | 2014534614 A | 12/2014 | |
| TW | 454264 B | 9/2001 | |

* cited by examiner

ELECTROSTATIC CHUCK AND REACTION CHAMBER

CROSS-REFERENCE TO RELATED APPLICATIONS

This application is a national phase entry under 35 U.S.C. § 371 of International Application No. PCT/CN2019/106684, filed on Sep. 19, 2019, which claims priority to Chinese Application No. 201811183845.3, filed Oct. 11, 2018, and Chinese Application No. 201821648321.2, filed Oct. 11, 2018, the entire contents of all of which are incorporated herein by reference.

TECHNICAL FIELD

The present disclosure generally relates to the semiconductor manufacturing field and, more particularly, to an electrostatic chuck and a reaction chamber.

BACKGROUND

Nowadays, physical vapor deposition (hereinafter referred to as PVD) technology is widely used for forming aluminum (Al) thin films in the semiconductor manufacturing field. However, in a process of forming the Al thin films, abnormal growth of the thin film material may occur due to the presence of impurities in the chamber, which causes generation of thorn-shaped or angular whisker defects as commonly existed problems. When the sizes of the whisker defects are large enough, product yield may be affected. Therefore, controlling the generation of impurities during the deposition of the Al films is an important method and measure to control the generation of whisker defects.

When PVD equipment is used to deposit the Al thin films, to fix, support, or transfer a wafer, and realize temperature control, a high-temperature electrostatic chuck is commonly used as a base for carrying the wafer. The current electrostatic chuck includes a temperature control device for controlling the temperature of the wafer. The temperature control device includes an insulating layer for carrying a wafer, a heating body for providing heat to the insulating layer, and a cooling pipe for cooling the heating body.

The existing temperature control device inevitably has the following problems in practical applications. That is, since the heating body is in direct contact with the cooling pipeline, the cooling water can only be introduced into the cooling pipeline during non-process time, and cannot be introduced during a high-temperature process, otherwise, the water in the cooling pipeline will be boiled. However, during the process, the failure of the cooling pipeline may cause the temperature of the heating body to gradually increase because the generated heat cannot be effectively transferred out in time. As such, the whisker defects are increased, and the product yield is seriously affected.

SUMMARY

The present disclosure is intended to at least solve one of the technical problems in the existing technology. The present disclosure provides an electrostatic chuck and a reaction chamber, which can realize stable temperature control on a heating body to effectively reduce whisker defects and to improve the product yield.

Embodiments of the present disclosure provide an electrostatic chuck to realize the intended purpose of the present disclosure. The electrostatic chuck includes an insulation layer and a heating body arranged at a bottom of the insulation layer. The electrostatic chuck further includes:
  a cooling pipeline, arranged under the heating body, spaced apart from the heating body, and configured to transfer cooling liquid; and
  a thin-wall structure, respectively connected to the heating body and the cooling pipeline and configured to transfer the heat from the heating body to the cooling pipeline.

Optionally, the thin-wall structure includes a heat transfer plate that is thin-wall shaped.

Optionally, the thin-wall structure further includes a ring-shaped connector. The ring-shaped connector is connected to a bottom of the heating body and arranged around the circumference of the cooling pipeline. The heat transfer plate is ring-shaped, and an inner wall and an outer wall of the heat transfer plate are in contact with the cooling pipeline and the ring-shaped connector, respectively.

Optionally, an axial thickness and a radial length of the heat transfer plate and/or contact areas where the inner wall and the outer wall of the heat transfer plate are respectively in contact with the cooling pipe and the ring-shaped connector, are set to control thermal dissipation efficiency of the heat transfer plate.

Optionally, wherein the heat dissipation efficiency of the heat transfer plate ranges from 10 W to 500 W.

Optionally, the heat transfer plate and the cooling pipeline are connected by welding.

Optionally, the thin-wall structure further includes:
  a heat absorption assembly, contacting the cooling pipeline, being opposite to the bottom of the heating body, and configured to absorb heat radiated by the heating body in a heat radiation manner and transfer the heat to the cooling pipeline.

Optionally, the heat absorption assembly includes a heat absorption plate, fixedly connected to the cooling pipeline. A plurality of heat absorption sheets are arranged on a surface of the heat absorption plate opposite to the heating body.

Optionally, the plurality of heat absorption sheets include a plurality of ring structures with different diameters. The plurality of ring structures are arranged concentrically.

Optionally, the cooling pipeline is arranged around an axis of the heat absorption plate.

Optionally, a vertical distance between the cooling pipeline and the heating body ranges from 2 mm-30 mm.

Optionally, the vertical distance between the cooling pipeline and the heating body is 5 mm.

As another technical solution, the present disclosure further provides a reaction chamber including the electrostatic chuck provided by the present disclosure.

The present disclosure has the following beneficial effects.

The electrostatic chuck provided by the present disclosure may realize the heat dissipation of the heating body with the use of the cooling pipeline and the thin-wall structure during the process. Boiling of the cooling liquid introduced in the cooling pipeline may be avoided during the high-temperature process by arranging the cooling pipeline spaced apart from the heating body. Thus, the cooling pipeline may be ensured for normal use during the process to effectively reduce the whisker defects. As such, the product yield may be improved.

The reaction chamber provided by the present disclosure may realize the stable temperature control for the heating body during the process by using the electrostatic chuck provided by the present disclosure. The reaction chamber may realize the stable temperature control for the heating body during the process to effectively reduce the whisker defects. As such, the product yield may be improved.

DETAILED DESCRIPTION OF THE EMBODIMENTS

To make those of ordinary skill in the art better understand the technical solutions of the present disclosure, an electrostatic chuck and a reaction chamber provided by the present disclosure are described in detail below in connection with the accompanying drawings.

Figure 1:
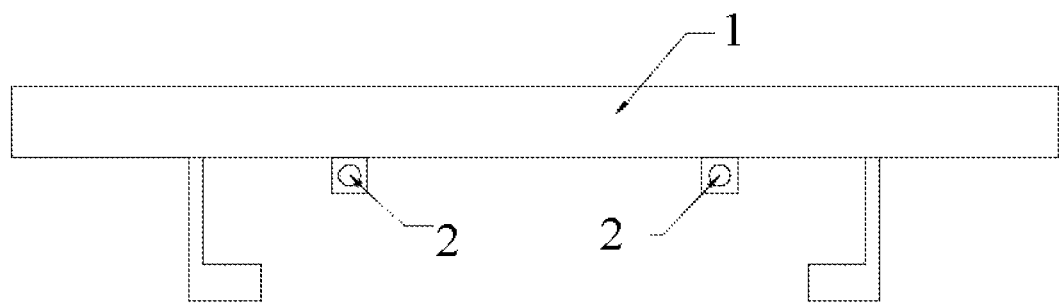
FIG. 1 is a schematic structural diagram of a temperature control device of an existing electrostatic chuck.

FIG. 1 is a schematic structural diagram of s temperature control device of an existing electrostatic chuck. As shown in FIG. 1, the temperature control device includes a heating body 1 arranged at a bottom of an insulating layer of the electrostatic chuck and configured to provide heat, and a cooling pipeline 2 arranged at a bottom of the heating body 1 and configured to cool the heating body 1.

Figure 2:
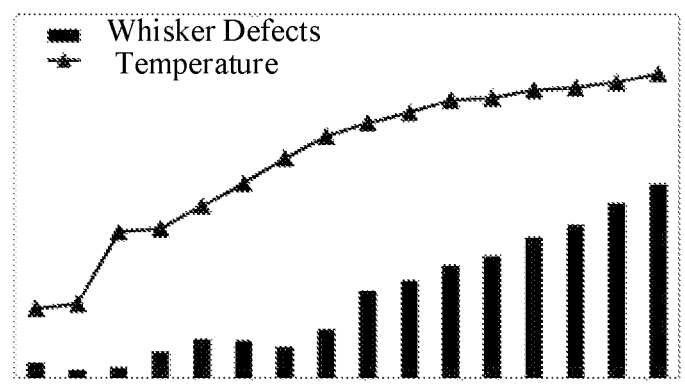
FIG. 2 is a schematic showing increase trend of heating body temperature and whisker defects in existing technology.

When a PVD equipment is used to perform a deposition process of an aluminum (Al) thin film, the process temperature of the deposition process of the Al thin film is usually 270° C. Target material sputtered from a target during the process may carry high energy. When the target material is deposited on a wafer, the temperature of the wafer may rise. The heat of the wafer may be transferred to the heating body 1 at the bottom of the electrostatic chuck through the electrostatic chuck, which causes the temperature of the heating body 1 to rise. However, since the heating body 1 is in direct contact with the cooling pipe 2, the cooling water can only be introduced into the cooling pipe 2 during non-process time, and the cooling water cannot be introduced into the cooling pipe 2 during a high-temperature process, otherwise, the water in the cooling pipe 2 may boil. However, during the process, the failure of the cooling pipe 2 may cause the temperature of the heating body 1 to gradually rise because the generated heat cannot be effectively transferred out in time. FIG. 2 is a schematic showing increase trend of heating body temperature increase and whisker defects in the existing technology. As shown in FIG. 2, as the temperature of the heating body 1 increases, the whisker defects increases, which seriously affects the product yield.

To resolve the above-mentioned problems, the present disclosure provides an electrostatic chuck, which includes an insulation layer. The insulation layer may be used to carry a to-be-processed workpiece. A direct-current (DC) electrode may be arranged in the insulating layer and may be configured to generate electrostatic attraction between the workpiece and the DC electrode, to fix the to-be-processed workpiece. In some embodiments, the insulating layer is made of ceramic material (e.g., $Al_2O_3$).

First Embodiment

Figure 3:
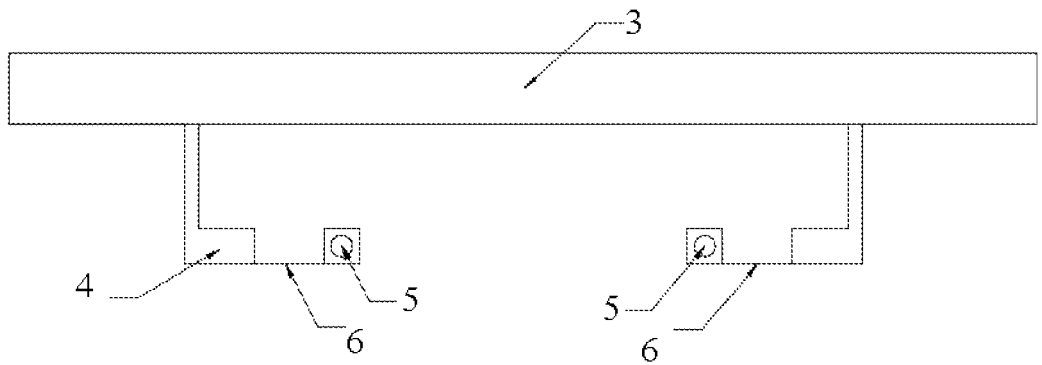
FIG. 3 is a schematic structural diagram of a temperature control device of an electrostatic chuck according to a first embodiment of the present disclosure.

Referring to FIG. 3, the electrostatic chuck provided by embodiments of the present disclosure includes the insulation layer (not shown) and a heating body 3 arranged at the bottom of the insulation layer and also includes a cooling pipeline 5 and a thin-wall structure. The cooling pipeline 5 is arranged under the heating body 3 and spaced apart from the heating body 3. That is, the cooling pipeline 5 and the heating body 3 are completely not in contact. The thin-wall structure is connected to the heating body 3 and the cooling pipeline 5, and is configured to dissipate the heat from the heating body 3 during the process and transfer the heat to the cooling pipeline 5. During the process, the thin-wall structure may effectively transfer the heat from the heating body 3 to the cooling pipe 5 timely and effectively. Moreover, the cooling water or other coiling liquid that can realize a cooling function may be introduced into the cooling pipe 5 to eventually dissipate the heat from the heating body 3. Since the cooling pipeline 5 is arranged spaced apart from the heating body 3, boiling of the cooling liquid introduced into the cooling pipeline 5 may be avoided during the high-temperature process(es). Therefore, the cooling pipeline 5 may be ensured to be normally used during the process. As such, the whisker defects may be effectively reduced, and the product yield may be improved.

In some embodiments, the cooling pipeline 5 may be arranged around the circumference of the heating body 3 to improve cooling uniformity.

In some embodiments, the thin-wall structure includes a ring-shaped connector 4 and a heat transfer plate 6 that is thin-wall shaped. The ring-shaped connector 4 is connected to the bottom of the heating body 3 and is arranged around the circumference of the cooling pipeline 5.

The heat transfer plate 6 is ring-shaped, and an inner wall and an outer wall of the heat transfer plate 6 are in contact with the cooling pipe 5 and the ring-shaped connector 4, respectively. The heat from the heating body 3 may be transferred to the heat transfer plate 6 through the ring-shaped connector 4 and may be transferred to the cooling pipeline 5 through the heat transfer plate 6. The heat transfer plate is thin-wall shaped, which means that the axial length of the heat transfer plate is much smaller than its radial thickness.

According to thin-wall characteristics of the heat transfer plate 6, even if the heat transfer plate 6 may contact the heating body 3 through the ring-shaped connector 4, the heat dissipation efficiency of the heat transfer plate 6 may not be too large. As such, boiling of the cooling liquid of the cooling pipeline 5 may be further avoided. In addition, according to the thin-walled characteristics of the heat transfer plate 6, the structure and size of the heat transfer plate 6 may be designed according to a flat heat transfer principle formula, so that the heat transfer speed may be accurately controlled. As such, stable temperature control for the heating body 3 may be realized during the process to obtain an optimal heat dissipation efficiency.

Specifically, the above-mentioned flat heat transfer principle formula is:

$$Q=\lambda(T1-T2)tA/\delta$$

where Q denotes a heat value per second transferred by the heat transfer plate 6 and has a unit of J, λ denotes a thermal conductivity of the heat transfer plate 6 and has a unit of W/(M~K), T1-T2 denotes a temperature difference between the ring-shaped connector 4 and the cooling pipeline 5 and has a unit of K, t denotes a heat transfer time and has a unit of s, A denotes a contact area and has a unit of m$^2$, and δ denotes a thickness of the heat transfer plate 6 and has a unit of m.

For example, the temperature T1 where the heat transfer plate 6 contacts the ring-shaped connector 4 is about 250° C., the temperature T2 where the heat transfer plate 6 contacts the cooling pipeline 5 is about 40° C., the thickness of the heat transfer plate 6 is 0.2 mm, and the contact area is 1.256E-4 m$^2$. By substituting the above parameters into the flat heat transfer principle formula, the heat value Q transferred by the heat transfer plate per second is calculated and obtained to be about 52 J. That is, the heat dissipation efficiency of the heat transfer plate 6 under this working condition is 52 W.

Based on the above principle, by changing the size and contact area of the heat transfer plate 6, the heat dissipation efficiency may be controlled within a range of 10 W 500 W.

According to the above-mentioned flat heat transfer principle formula, the heat dissipation efficiency of the heat transfer plate may be controlled by setting the axial thickness and radial length of the heat transfer plate 6 and/or the contact areas where the inner and outer walls of the heat transfer plate 6 in contact with the cooling pipe 5 and the ring-shaped connector 4, respectively.

In some embodiments, the heat transfer plate 6 and the cooling pipeline 5 may be connected by welding. In addition, the heat transfer plate 6 and the ring-shaped connector 4 may also be connected by welding, or may simply be attached to each other.

In some embodiments, the ring-shaped connector 4 may be connected to a bellows to achieve vacuum sealing of the chamber. Specifically, the ring-shaped connector 4 may also include a heat transfer ring. An upper end of the heat transfer ring is connected to the bottom of the heating body 3, and a lower end of the heat transfer ring includes a ring-shaped protrusion. The ring-shaped protrusion protrudes relative to the inner wall of the heat transfer ring and contacts the heat transfer plate 6. In addition, an upper flange is arranged at a top of the bellows and is sealed with and connected to the ring-shaped protrusion. A lower flange is arranged at the bottom of the bellows and is sealed with and connected to a bottom chamber wall of the reaction chamber. Moreover, a through-hole is arranged at the bottom chamber wall. The through-hole is located inside the bellows. A lifting shaft extends vertically upwards from the outside of the chamber to the inside of the chamber through the through-hole. The lifting shaft is sleeved inside the bellows. The upper end of the lifting shaft is connected to the upper flange, and the lower end of the lifting shaft is connected to a drive source. Driven by the drive source, the lifting shaft drives the electrostatic chuck to move up and down. As such, the sealing of the chamber may be ensured.

In some embodiments, the ring-shaped protrusion of the ring-shaped connector 4 and the above-mentioned upper flange may be sealed and connected by welding. The sealing method may be applied to a high-temperature chamber that requires high vacuum and granularity.

In some embodiments, the distance between the cooling pipeline 5 and the heating body 3 ranges from 2 mm to 30 mm, and preferably 5 mm. In the range, boiling of the cooling liquid introduced into the cooling pipeline 5 may be avoided during a high-temperature operation, and the heat from the heating body 3 may be effectively dissipated in time.

In some embodiments, the heat transfer plate 6 may realize the cooling of the heating body 3 through the ring-shaped connector 4, however, the present disclosure is not limited to this. In practical applications, the ring-shaped connector 4 may also be omitted. The heat transfer plate 6 may be connected to the heating body 3 and the cooling pipeline 5. As such, the heat transfer plate 6 may also transfer the heat from the heating body 3 to the cooling pipeline 5. Moreover, with the help of the thin-wall characteristic of the heat transfer plate 6, even if the heat transfer plate 6 is in direct contact with the heating body 3, which cannot cause the cooling liquid in the cooling pipe 5 to boil. Thereby, the cooling of the heating body 3 may be realized during the process.

It needs to be noted that, in some embodiments, the thin-wall structure includes the heat transfer plate that is thin-wall shaped 6. However, the present disclosure is not limited to this. In practical applications, the thin-wall structure may also include any other structures, as long as it can realize the heat dissipation of the heating body 3, while ensuring that the cooling liquid in the cooling pipeline 5 does not boil.

Second Embodiment

Figure 4:
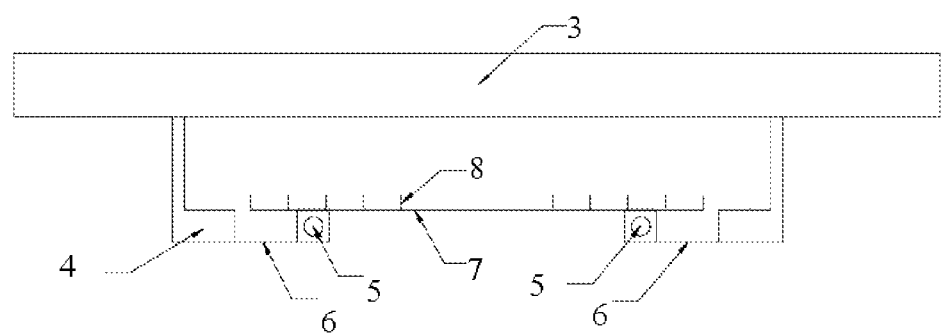
FIG. 4 is a schematic structural diagram of a temperature control device of the electrostatic chuck according to a second embodiment of the present disclosure.

Referring to FIG. 4, an electrostatic chuck provided by embodiments of the present disclosure includes an improvement made based on the first embodiment. Specifically, the electrostatic chuck also includes the insulation layer, the heating body 3 arranged at the bottom of the insulation layer, the cooling pipeline 5, the ring-shaped connector 4, and the heat transfer plate 6. Since the structures and functions of these components are described in detail in the first embodiment, which is not be described here.

In some embodiments, the electrostatic chuck further includes a heat absorption assembly. The heat absorption assembly is in contact with the cooling pipeline 5 and is arranged opposite to the bottom of the heating body. The heat absorption assembly is configured to absorb the heat radiated by the heating body 3 in a heat radiation manner and transfer the heat to the cooling pipeline 5.

With the help of the heat absorption assembly, the heat dissipation of the heating body 3 may be further increased, especially the heat dissipation of the central area of the heating body 3. Thus, a heat dissipation rate of the central area may be faster than a heat dissipation rate of an edge area, so as to compensate for the temperature difference between the central area and the edge area of the heating body 3 (the temperature rise in the central area is more serious during the process). As such, the temperature uniformity of the heating body 3 may be improved, and the temperature uniformity of the to-be-processed workpiece may be improved.

In some embodiments, a heat absorption assembly includes a heat absorption plate 7. The heat absorption plate 7 is fixedly connected to the cooling pipeline 5. Moreover, a plurality of heat absorption sheets 8 are arranged at the surface of the heat absorption plate 7, which is opposite to the heating body 3. The heat from the heating body 4 may be transferred to the heat absorption sheets 8 through heat radiation and heat convection of air and transferred to the cooling pipeline 5 through the heat absorption plate 7.

Figure 5:
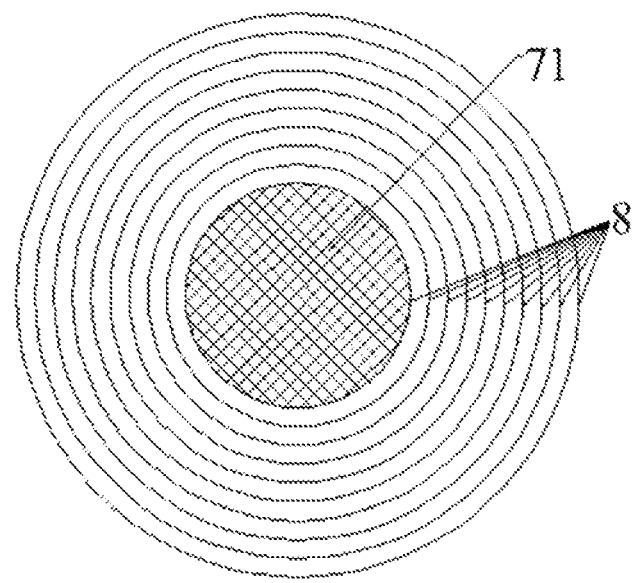
FIG. 5 is a schematic top view of a heat absorption assembly according to the second embodiment of the present disclosure.

In some embodiments, as shown in FIG. 5, the plurality of heat absorption sheets 8 include a plurality of ring structures with different inner diameters. The plurality of ring structures are arranged concentrically. As such, the cooling uniformity of the heating body 3 may be improved, and the temperature uniformity of the heating body 3 may be further improved.

Of course, in practical applications, the size (including height, thickness, spacing, distribution position, etc.) of a heat absorption sheet may be designed according to specific needs.

In some embodiments, to improve the uniformity of the heat transfer, the cooling pipeline 5 is arranged around the axis of the heat absorption plate 7.

In addition, a central hole 71 is arranged at the heat absorption plate 7 and configured to wire the DC electrode or the heating electrode into or out the electrostatic chuck.

Figure 6:
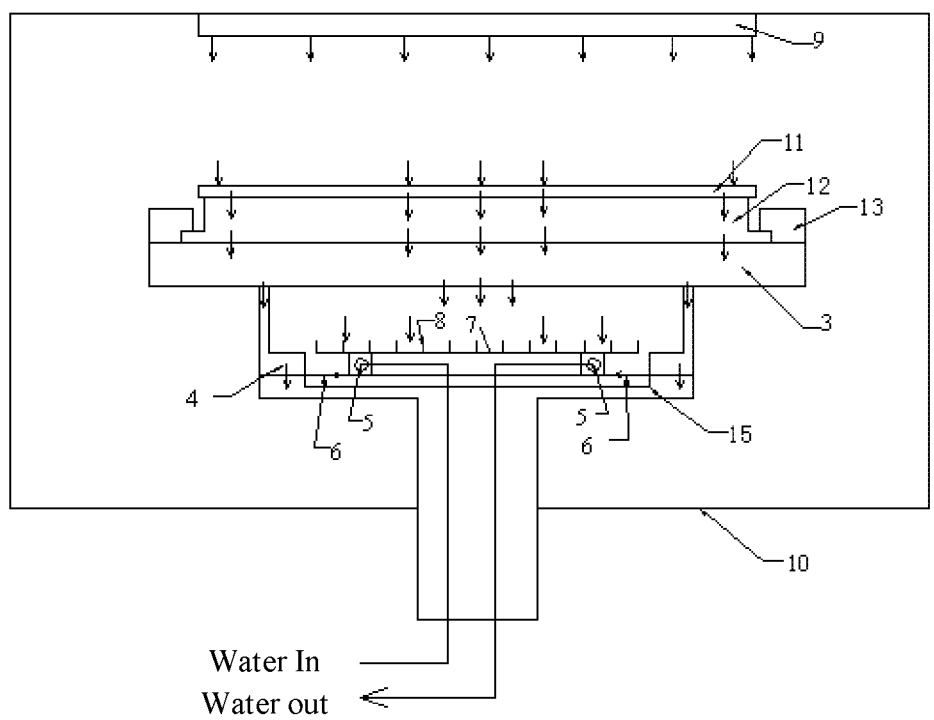
FIG. 6 is a schematic heat flow diagram of the electrostatic chuck according to the second embodiment of the present disclosure.

In the following, taking the PVD process as an example, the heat flow distribution of the electrostatic chuck provided by embodiments of the present disclosure is described in detail. Referring to FIG. 6, when the PVD process is performed, plasma bombards a target 9 to generate metal ions. The metal ions move from the target 9 to the surface of the wafer 11 and carry a certain amount of energy. The energy may be converted into heat and transferred to the wafer 11 after the metal ions contact the wafer 11. At this moment, the central area of the wafer 11 may obtain more energy, and the edge area of the wafer 11 may obtain less energy. The wafer 11 may transfer the energy to the insulation layer 12 of the electrostatic chuck. The insulation layer 12 may transfer the energy to the heating body 3. The heat from the heating body 3 may be transferred to the cooling pipeline 5 through two paths at the same time and dissipated through the cooling liquid in the cooling pipeline 5. The first path is that the heat may be conducted to the heat transfer plate 6 through the ring-shaped connector 4 and then transferred to the cooling pipe 5. The second path is that the heat may be transferred to the heat absorption sheets 8 and the heat absorption plate 7 through the heat radiation and heat convection of the air and then transferred to the cooling pipeline 5.

Figure 7:
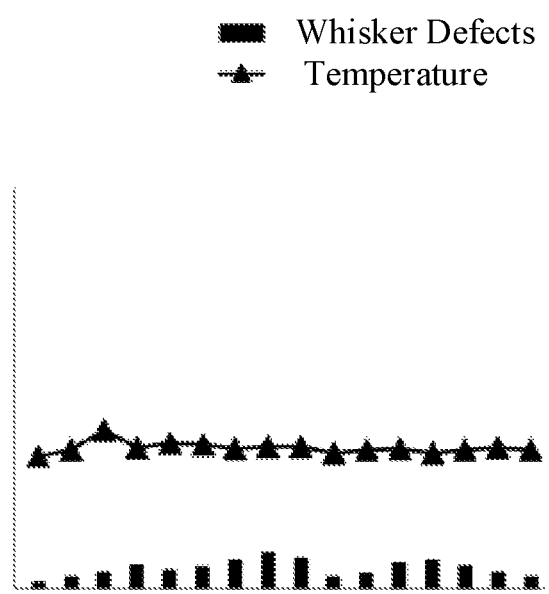
FIG. 7 is a schematic showing increase trend of heating body temperature and whisker defects according to the second embodiment of the present disclosure.

As shown in FIG. 7, by using the electrostatic chuck provided by embodiments of the present disclosure, during the process, the temperature of the heating body 3 is basically kept constant. The heat balance is realized. Thus, the whisker defects may be effectively reduced.

As another technical solution, the present disclosure also provides a reaction chamber. The reaction chamber includes the electrostatic chuck provided by embodiments of the present disclosure.

Specifically, in some embodiments, as shown in FIG. 6, the reaction chamber 10 includes a PVD chamber. The target is arranged in the reaction chamber 10. The electrostatic chuck is arranged below the target 9. The electrostatic chuck includes the insulating layer 12, which is configured to carry the wafer 11. The insulating layer 12 may be fixed at the heating body 3 by a pressure ring 13.

The ring-shaped connector 4 is connected to the bottom of the heating body 3 and arranged around the circumference of the cooling pipeline 5. In some embodiments, the ring-shaped connector 4 is connected to the bellows 15, which is configured to realize the vacuum sealing of the chamber. Specifically, the ring-shaped connector 4 may include a heat transfer ring. An upper end of the heat transfer ring is connected to the bottom of the heating body 3, and the ring-shaped protrusion is arranged at a lower end of the heat transfer ring. The ring-shaped protrusion protrudes relative to the inner wall of the heat transfer ring and contacts the heat transfer plate 6. In addition, the upper flange is arranged at the top of the bellows 15 and is sealed with and connected to the ring-shaped protrusion. The lower flange is arranged at the bottom of the bellows 15 and is sealed with and connected to a bottom chamber wall of the reaction chamber or extends to the outside of the reaction chamber 10 and is sealed with and connected to the lifting shaft (not shown). In addition, the through-hole is arranged at the bottom chamber wall. The through-hole is located inside of the bellows 15. The lifting shaft extends vertically upwards from the outside of the chamber to the inside of the chamber through the through-hole. The lifting shaft is sleeved inside the bellows 15. The upper end of the lifting shaft is connected to the upper flange. The lower end of the lifting shaft is connected to the drive source. Driven by the drive source, the lifting shaft drives the electrostatic chuck to move up and down. Therefore, the sealing of the chamber may be ensured.

The reaction chamber provided by the present disclosure may realize the stable temperature control of the heating body during the process by using the above-mentioned electrostatic chuck provided by the present disclosure. As such, not only the whisker defects may be effectively reduced, but also an optimum thermal efficiency may be obtained.

It can be understood that the above embodiments are merely exemplary embodiments used to illustrate the principle of the present disclosure, but the present disclosure is not limited to this. For those of ordinary skill in the art, various modifications and improvements may be made without departing from the spirit and essence of the present disclosure. These modifications and improvements are also within the scope of the present disclosure.

What is claimed is:
1. An electrostatic chuck comprising:
an insulation layer;
a heating body arranged at a bottom of the insulation layer;
a cooling pipeline, arranged under the heating body, spaced apart from the heating body, and configured to transfer cooling liquid; and
a thin-wall structure, respectively connected to the heating body and the cooling pipeline and configured to transfer heat from the heating body to the cooling pipeline, including:
a ring-shaped connector connected to a bottom of the heating body and surrounding the cooling pipeline; and
a thin-wall shaped heat transfer plate being ring-shaped, an inner wall and an outer wall of the heat transfer plate being in contact with the cooling pipeline and the ring-shaped connector, respectively.

2. The electrostatic chuck according to claim 1, wherein an axial thickness and a radial length of the heat transfer plate and/or contact areas where the inner wall and the outer wall of the heat transfer plate are respectively in contact with the cooling pipe and the ring-shaped connector, are set to control heat dissipation efficiency of the heat transfer plate.

3. The electrostatic chuck according to claim 2, wherein the heat dissipation efficiency of the heat transfer plate ranges from 10 W to 500 W.

4. The electrostatic chuck according to claim 1, wherein the heat transfer plate and the cooling pipeline are connected by welding.

5. The electrostatic chuck according to claim 1, wherein the thin-wall structure further includes:
a heat absorption assembly, contacting the cooling pipeline, being opposite to the bottom of the heating body, and configured to absorb heat radiated by the heating body in a heat radiation manner and transfer the heat to the cooling pipeline.

6. The electrostatic chuck according to claim 5, wherein the heat absorption assembly includes:
a heat absorption plate, fixedly connected to the cooling pipeline, and a plurality of heat absorption sheets being arranged on a surface of the heat absorption plate opposite to the heating body.

7. The electrostatic chuck according to claim 6, wherein the plurality of heat absorption sheets include a plurality of ring structures with different diameters, the plurality of ring structures being arranged concentrically.

8. The electrostatic chuck according to claim 6, wherein the cooling pipeline is arranged around an axis of the heat absorption plate.

9. The electrostatic chuck according to claim 1, wherein a vertical distance between the cooling pipeline and the heating body ranges from 2 mm-30 mm.

10. The electrostatic chuck according to claim 9, wherein the vertical distance between the cooling pipeline and the heating body is 5 mm.

11. A reaction chamber, comprising an electrostatic chuck including:
an insulation layer;
a heating body arranged at a bottom of the insulation layer;
a cooling pipeline, arranged under the heating body, spaced apart from the heating body, and configured to transfer cooling liquid; and
a thin-wall structure, respectively connected to the heating body and the cooling pipeline and configured to transfer heat from the heating body to the cooling pipeline, including:
a ring-shaped connector connected to a bottom of the heating body and surrounding the cooling pipeline; and
a thin-wall shaped heat transfer plate being ring-shaped, an inner wall and an outer wall of the heat transfer plate being in contact with the cooling pipeline and the ring-shaped connector, respectively.

12. The reaction chamber according to claim 11, wherein an axial thickness and a radial length of the heat transfer plate and/or contact areas where the inner wall and the outer wall of the heat transfer plate are respectively in contact with the cooling pipe and the ring-shaped connector, are set to control heat dissipation efficiency of the heat transfer plate.

13. The reaction chamber according to claim 12, wherein the heat dissipation efficiency of the heat transfer plate ranges from 10 W to 500 W.

14. The reaction chamber according to claim 11, wherein the heat transfer plate and the cooling pipeline are connected by welding.

15. The reaction chamber according to claim 11, wherein the thin-wall structure further includes:
a heat absorption assembly, contacting the cooling pipeline, being opposite to the bottom of the heating body, and configured to absorb heat radiated by the heating body in a heat radiation manner and transfer the heat to the cooling pipeline.

16. The reaction chamber according to claim 15, wherein the heat absorption assembly includes:
a heat absorption plate, fixedly connected to the cooling pipeline, and a plurality of heat absorption sheets being arranged on a surface of the heat absorption plate opposite to the heating body.

17. The reaction chamber according to claim 16, wherein the plurality of heat absorption sheets include a plurality of ring structures with different diameters, the plurality of ring structures being arranged concentrically.

18. The reaction chamber according to claim 16, wherein the cooling pipeline is arranged around an axis of the heat absorption plate.

19. The reaction chamber according to claim 11, wherein a vertical distance between the cooling pipeline and the heating body ranges from 2 mm-30 mm.

20. The reaction chamber according to claim 19, wherein the vertical distance between the cooling pipeline and the heating body is 5 mm.

\* \* \* \* \*